United States Patent [19]
Uchida

[11] Patent Number: 6,057,560
[45] Date of Patent: May 2, 2000

[54] MULTI-LAYER, MIRROR OF COMPOUND SEMICONDUCTORS INCLUDING NITROGEN AND SURFACE LIGHT-EMITTING DEVICE WITH THE SAME

[75] Inventor: Mamoru Uchida, Yokohama, Japan

[73] Assignee: Canon Kabushiki Kaisha, Tokyo, Japan

[21] Appl. No.: 08/938,817

[22] Filed: Sep. 26, 1997

[30] Foreign Application Priority Data

Oct. 7, 1996 [JP] Japan .................................. 8-284694
Aug. 5, 1997 [JP] Japan .................................. 9-223083

[51] Int. Cl.$^7$ ................................................ H01L 33/00
[52] U.S. Cl. ................................. 257/94; 257/97; 257/98
[58] Field of Search ................................................ 257/94

[56] References Cited

U.S. PATENT DOCUMENTS

| 5,249,244 | 9/1993 | Uchida | 385/15 |
| 5,359,447 | 10/1994 | Hahn et al. | 359/154 |
| 5,359,618 | 10/1994 | Lebby et al. | 372/45 |
| 5,493,577 | 2/1996 | Choquette et al. | 372/46 |
| 5,625,202 | 4/1997 | Chai | 257/94 |
| 5,689,123 | 11/1997 | Major et al. | 257/190 |
| 5,825,796 | 10/1998 | Jewell et al. | 372/45 |

FOREIGN PATENT DOCUMENTS

| 0 536 944 | 4/1993 | European Pat. Off. |
| 7-297476 | 11/1995 | Japan . |
| 8-139414 | 5/1996 | Japan . |
| WO 96/24167 | 8/1996 | WIPO . |

OTHER PUBLICATIONS

GaInNAs: A Novel Material for Long–Wavelength–RAnge Laser Diodes with Excellent High–Temperature Performance. Kondow et al. Jap J. Appl. Phys. V35, 1273–1275, Feb. 1996.

D.I. Babic, et al., Double Fused 1.52 $\mu$m Vertical–Cavity Lasers, Applied Physics Letters, 66(9), pp. 1030–1032 (Feb. 1995).

M. Kondow, et al., GaInNAs: A Novel Material for Long–Wavelength–Range Laser Diodes with Excellent High–Temperature Performance, Japan Journal of Applied Physics, vol. 35, pp. 1273–1275 (Feb. 1996).

Patent Abstracts of Japan, vol. 096, No. 009, (JP 08–139414, May 31, 1996), Sep. 30, 1996.

Patent Abstracts of Japan, vol. 096, No. 003, (JP 07–297476, Nov. 10, 1995), Mar. 29, 1996.

Y. Hayashi, et al., "Record Low–Threshold Index–Guided InGaAs/GaAlAs Vertical–Cavity Surface–Emitting Laser with a Native Oxide Confinement Structure," Electronics Letters, vol. 31, No. 7, Mar. 30, 1995, pp. 560–562.

U. Fiedler, et al., "Proton Implanted VCSEL's for 3 Gb/s Data Links," IEEE Photonics Technology Letters, vol. 7, No. 10, Oct. 1, 1995, pp. 1116–1118.

T. Baba, et al., "Low Threshold 1.3 $\mu$m GaInAsP/InP Circular Planar Buried Heterostructure Surface Emitting Lasers," Journal of Japanese Academy of Electronics Information Communications, vol. J76–C–1, No. 10, pp. 367–374 (1993).

*Primary Examiner*—Olik Chaudhuri
*Assistant Examiner*—Douglas A. Wille
*Attorney, Agent, or Firm*—Fitzpatrick, Cella, Harper & Scinto

[57] ABSTRACT

A surface light-emitting device includes an active layer and a set of reflectors. The reflectors are arranged on both opposite sides of the active layer such that light can be emitted in a direction perpendicular to the active layer. At least a portion of the reflectors includes a plurality of layers of compound semiconductors at least one of which includes nitrogen. Current is injected into the active layer, and the intensity of the light emitted from the surface light-emitting device is changed by the current modulated in accordance with a signal to be transmitted. At least one of the layers of compound semiconductors may also include aluminum.

23 Claims, 12 Drawing Sheets

MULTI-LAYER, MIRROR OF COMPOUND SEMICONDUCTORS INCLUDING NITROGEN AND SURFACE LIGHT-EMITTING DEVICE WITH THE SAME

BACKGROUND OF THE INVENTION

1. Field of the Invention

The present invention relates to a surface light-emitting device, such as a vertical cavity surface emitting laser (hereinafter also referred to as VCSEL), for use in, for example, optical communications, optical information processing, optical computing. The invention also relates to a compound semiconductor multi-layer mirror with layers including nitrogen for use in, for example, the surface light-emitting device. The invention also relates to a method for fabricating the surface light-emitting device, and an optical communication system using the surface light-emitting device.

2. Description of the Related Art

In recent years, a surface light-emitting device, especially VCSEL, has been actively studied because the device has a wide range of applications, including optical communications, optical information processing, and optical computing. The VCSEL is superior to an ordinary edge-emitting laser because (1) its structure is simple, (2) its operation current is small, and (3) the devices can be checked as a wafer unit on which a number of devices are formed.

On the other hand, the VCSEL also has several drawbacks. For example, the disadvantages listed below occur in a VCSEL having an oscillation wavelength in a 1.3 $\mu$m–1.55 $\mu$m band with an active layer of InGaAsP-series compound semiconductor when a distributed Bragg reflector (DBR) mirror is formed with a semiconductor multi-layer of InP/InGaAs(P). The disadvantages occur because a difference in refractive index between paired semiconductors (the multi-layer consists of a number of sets of paired semiconductors) of the mirror is small and thermal resistance of InGaAsP is several times larger than that of InP.

(1) Electrical resistance is high. Since the index difference between the paired semiconductors is small as described above, the number of layers of the multi-layer mirror must be increased to achieve high reflectance. Hence, the number of hetero-barriers increases and the thickness of the multi-layer mirror increases. Thus, when a current is injected through the DBR mirror, the electrical resistance thereof is very high.

(2) Thermal resistance is high. Since the number of layers of InGaAsP having a large thermal resistance is increased, the total thermal resistance of the mirror abruptly increases. This lowers the efficiency of heat radiation by a heat sink.

For these two reasons, a large amount of heat is generated, and the heat is likely to accumulate in VCSEL. Therefore, the temperature dependence of characteristics of injected-current vs. light-output in VCSEL (in particular, that in the 1.3 $\mu$m–1.55 $\mu$m band) is exceedingly degraded. That is, its characteristic temperature $T_0$ is small and its maximum CW temperature is low.

To solve these problems, there is a known method of using a dielectric multi-layer mirror, which can attain a relatively-large index difference between paired layers, in place of the semiconductor multi-layer mirror. (See, for example, Journal of Japanese Academy of Electronics Information Communications, volume of J76-C-1, No. 10, pp. 367–374 (1993).) FIG. 1 illustrates a cross section of VCSEL fabricated by that method.

In FIG. 1, reference numeral 601 denotes an InP substrate. Reference numeral 602 denotes an n-type clad layer. Reference numeral 603 denotes an InGaAsP active layer. Reference numeral 604 denotes a p-type InP clad layer. Reference numeral 605 denotes a p-type InGaAsP cap layer. Reference numerals 606 and 607 denote dielectric DBR multi-layers of $SiO_2$/Si or the like, respectively. Reference numerals 608 and 609 denote annular electrodes, respectively. Reference numeral 611 denotes an etching stopper layer for use in forming a window (in which the dielectric DBR multi-layer 606 is formed) in the substrate 601.

In the VCSEL shown in FIG. 1, a desired reflectance can be obtained and its operation current can be reduced during pulsative operation. In the dielectric multi-layer mirror of FIG. 1, however, operation current tends to increase and light output is limited due to heat generation therein during continuous operation. Further, since the dielectric multi-layer is used instead of the semiconductor multi-layer, the multi-layer mirror can not be fabricated continuously along with other semiconductor layers. Thus, fabrication tends to be complicated and costly.

In a second known method to solve the above problems, a semiconductor multi-layer mirror of AlGaAs/GaAs, whose lattice constant is different from that of epitaxially-grown layers including an active layer, is fabricated separately from those epitaxially-grown layers. The separately-formed multi-layer mirror is then directly bonded to the epitaxially-grown layers by adhesive. (See, for example, Babic et al, "Double Fused 1.52 $\mu$m Vertical-Cavity Lasers", Applied Physics Letters, 66(9), pp. 1030–1032 (1995).)

In this second known laser, a desired reflectance can be obtained (i.e., as seen from FIG. 7, a band gap difference corresponding to the index difference between AlGaAs/GaAs can be expanded, compared with InP/InGaAs(P), and the mirror of AlGaAs/GaAs does not function as an absorptive layer for light in the 1.3 $\mu$m–1.55 $\mu$m band (indicated by a dotted line W in FIG. 7)), and a current constriction structure can be readily formed by an oxidation process of the AlAs layer. Therefore, low-current operation can be initially executed. However, the laser has poor temperature characteristics because the active layer, which is vulnerable to heat, still exists. The laser is also costly and unreliable because three substrates (two for two sets of the semiconductor multi-layer mirrors and one for the epitaxially-grown layers), three semiconductor growth processes, and a bonding process are needed. Thus, the second known method is not yet a satisfactory method.

Furthermore, in recent years, III–V N obtained by adding nitrogen to a conventional III–V compound semiconductor has been reported. (See Kondow et al, "GaInNAs: A Novel Material for Long Wavelength Range Laser Diodes with Excellent High-Temperature Performance", Japan Journal of Applied Physics Letters, 35, pp. 1273–1275 (1996)). For example, a GaInNAs/GaAs quantum well active layer laid down over a GaAs substrate and a GaNAsP/GaNP quantum well active layer laid down over a Si substrate not only cover a range of 1.3 $\mu$m–1.55 $\mu$m (as is seen from FIG. 7, thick lines of GaInNAs and GaNAsP can be caused to cross the dotted line W at vertical lines of GaAs and Si which indicate semiconductors lattice-matched to GaAs and Si, respectively), but also offer a band-offset amount in a conduction band larger than that of an ordinary InGaAs/InGaAsP quantum well. Therefore, temperature characteristics of those active layers are expected to be drastically improved. However, an optimum structure of VCSEL using such new material has not yet been proposed.

SUMMARY OF THE INVENTION

It is therefore an object of the present invention to provide a surface light-emitting device, such as VCSEL of InGaAsP series and the like for a wavelength band of 1.3 μm–1.55 μm, whose characteristics, including a temperature characteristic, are improved, a compound semiconductor multi-layer mirror with layers including nitrogen for use in the surface light-emitting device and the like, a method for fabricating the surface light-emitting device, and an optical communication system using the surface light-emitting device.

The present invention is directed to a semiconductor multi-layer mirror in an optical device, such as VCSEL, in which a nitrified compound semiconductor, such as GaInNAs, is used in place of InGaAsP, for example, whose refractive index is close to the refractive index of InP and whose thermal resistance is large. More particular construction of the present invention is as follows.

A compound semiconductor multi-layer mirror according to the invention includes a plurality of layers of compound semiconductors, at least one of which contains nitrogen. In this mirror, the plurality of layers of compound semiconductors may include at least one set of paired layers, and the set of paired layers includes a semiconductor layer including no nitrogen and a semiconductor layer including nitrogen. Further, the semiconductor layer including no nitrogen and the semiconductor layer including nitrogen are approximately lattice-matched to each other.

The multi-layer mirror is used in a device, such as a surface light-emitting device which includes an active layer and a set of reflectors or mirrors that are arranged on both opposite sides of the active layer such that light can be emitted in a direction perpendicular to the active layer.

More specifically, the construction of the present invention can have the following first configuration:

The plurality of layers of compound semiconductors of the multi-layer mirror consist of a plurality of sets of paired layers, each of which includes a semiconductor layer of InP and a semiconductor layer of one of GaInNAs and GaInNAsP which are lattice-matched to the InP, or a semiconductor layer of InP and a semiconductor layer of GaNSb which is lattice-matched to the InP, or a semiconductor layer of GaAs and a semiconductor layer of one of GaInNAs and GaInNAsP which are lattice-matched to the GaAs.

The structural principle of the first configuration will be described. FIG. 7 shows the relationship between the lattice constant and the band gap energy of primary III–V compound semiconductors. As can be seen therefrom, when nitrogen (N) is added to the III–V compound semiconductor, the relationship between the lattice constant and the band gap energy thereof becomes converse to that of an ordinary III–V compound semiconductor, such as GaInAsP. That is, in the case of the N-added III–V compound semiconductor, its band gap energy decreases as its lattice constant decreases. This phenomenon is attributable to a large difference in electron affinity between nitrogen and other V-group elements. Therefore, a difference in refractive index between two compound semiconductors with approximately the same lattice constant, such as InP/GaInNAsP, InP/GaNSb and GaAs/GaInNAs, can be made larger than that of a case of InP/InGaAsP. As a result, in a multi-layer mirror of InP/GaInNAsP, for example, reflectance can be increased by using a smaller number of layers than are used in multi-layer of InP/GaInAsP multi-layer mirrors. Both of the paired layers may include nitrogen, though only one layer of the paired layers includes nitrogen in the above cases.

Further, the construction of the present invention can have the following second configuration:

At least one of the compound semiconductors includes nitrogen and at least one of the compound semiconductors includes aluminum (Al) in the second configuration. More specifically, the plurality of layers of compound semiconductors consist of a plurality of sets of paired layers, and the set of paired layers includes a semiconductor layer of one of AlAs and AlGaAs and a semiconductor layer of one of GaInNAs and GaInNAsP which are lattice-matched to GaAs. In this case, the active layer of the surface light-emitting device may also include nitrogen. For example, the active layer may be comprised of GaInNAs whose lattice constant is close to that of GaAs.

Further, portions of the layers of compound semiconductor including Al can be oxidized to be high-resistance portions such that carriers injected into the layers of compound semiconductors are constricted. This structure can be produced by thermally oxidizing the portions of the layers of compound semiconductor including Al with water vapor and changing the thermally-oxidized portions of the layers to high-resistance portions such that carriers injected into the layers of compound semiconductors can be constricted.

The operation of the compound semiconductor multi-layer mirror having the second configuration will be described.

Desirable characteristics of the reflector in the device, such as VCSEL, are as follows, as can be understood from the description of the problems with known devices. The more the reflector satisfies, the better the reflector is.

(1) High reflectance (in order to decrease the driving current), (2) Low electric resistance (in order to lower the driving voltage), (3) Low thermal resistance (in order to prevent a rise of temperature near the active layer), and (4) Readily builds the current constriction structure.

Regarding (1), since absorption of light must be small, such a semiconductor as has a larger band gap energy than energy of oscillation wavelength is needed. Regarding (2), it is required that a difference in refractive index between the paired layers of the multi-layer mirror be large (similar to the first configuration, it can be seen from FIG. 7 that this requirement is also met in the second configuration). That is, the larger the index difference, the fewer the number of layers the mirror needs to attain a desired reflectance. From the electrical standpoint, the resistance of the mirror decreases since the number of hetero-interfaces is reduced in the mirror. Regarding (3), it is known that material including Al has a small thermal resistance. Regarding (4), material including Al can be readily oxidized by thermally processing the material in water vapor and the resistance thereof can be increased. Further, regarding (3), it can be said that this condition is adequately satisfied since the number of layers can be reduced. Also in the second configuration, both of the paired layers may include Al, though only one layer of the paired layers includes Al in the above cases.

The temperature characteristic of the active layer will be described with reference to FIG. 7 which shows the relationship between lattice constant and band gap energy. As described above, when nitrogen (N) is added to the III–V compound semiconductor, the relationship between the lattice constant and the band gap energy thereof becomes converse to that of an ordinary III–V compound semiconductor, such as GaInAsP and AlGaAs. That is, in the case of the N-added III–V compound semiconductor, its band gap energy decreases as its lattice constant decreases (see thick lines in FIG. 7). For example, with respect to GaInNAs which is lattice-matched to GaAs, its oscillation wavelength covers a band range from 1.3 μm to 1.55 μm and its band-offset amount in the conduction band (not valence band) is larger than that of an ordinary III–V compound semiconductor. By using this phenomenon (i.e., the band-offset amount in the conduction band between a layer including N, such as GaInNAs, and its adjacent layer (e.g., a layer of GaAs) is large), the temperature characteristic of the active layer can be improved. That is, even when the temperature rises, it is hard for injected electrons to overflow from the N-added layer, and the injected electrons can efficiently recombine with holes and thus the radiation efficiency is improved. This fact can be utilized not only for a multiple quantum well active layer (in this case, its well layer includes nitrogen), but also for a single quantum well active layer and a bulk active layer.

A large index difference obtained in the second configuration will be further described. FIG. 8 shows wavelength dependencies or dispersions of refractive indices of primary compound semiconductors. It can be seen therefrom that a refractive-index difference of AlAs/GaInNAs is larger than that of an ordinarily-used AlAs/GaAs at a wavelength of 1.3 $\mu$m. For example, when $Ga_{0.8}In_{0.2}N_{0.02}As_{0.98}$ is used, a refractive-index difference between the $Ga_{0.8}In_{0.2}N_{0.02}As_{0.98}$ and AlAs can be 0.75, and the number of paired layers for achieving a reflectance of 99.99% is about two thirds (⅔) of that known in the art. This results in reduction of Joule's heat due to a decrease in the driving voltage and expansion of heat radiation due to a decrease in thermal resistance. Thus, factors of the mirror, which would otherwise impair the temperature characteristic, can be drastically improved. This is also true in the above-discussed first cofiguration.

As is discussed in the foregoing, the present invention is characterized in that nitrified III–V compound semiconductor, represented by GaInNAs, is used in at least a portion of a multi-layer mirror. When the mirror further includes a layer containing Al, the above (3) and (4) can also be readily satisfied thereby since material contaning Al has a small thermal resistance and this material can be readily oxidized in water vapor to have a high electrical resistance. Further, when material containing nitrogen is also used in an active layer of a device, such as VCSEL, its temperature characteristic can be improved since its band-offset amount in the conduction band can be enlarged. Such an active layer can also cover a radiation wavelength of a band range from 1.3 $\mu$m to 1.55 $\mu$m, which is desirable for optical communications.

Further, an optical communication system of the present invention for communicating over a light transmission medium that transmits a signal from a transmitter side to a receiver side is characterized by (a) a transmitter which includes the above-described surface light-emitting device of the present invention, a current injecting unit for injecting current into an active layer of the surface light-emitting device and a control unit for controlling the current injecting unit such that the intensity of the light emitted from the surface light-emitting device is changed in accordance with a signal input into the control unit, and (b) a receiver for receiving a signal from the transmitter.

Furthermore, an optical communication method of the present invention for communicating over a light transmission medium that transmits a signal from a transmitter side to a receiver side is characterized in that the above-mentioned transmitter is caused to transmit an optical signal whose intensity is modulated in accordance with the signal input into the control unit.

These advantages and others will be more readily understood in connection with the following detailed description of the preferred embodiments in conjunction with the drawings.

DESCRIPTION OF THE PREFERRED EMBODIMENTS

Embodiments having specific structures will be described hereinafter with reference to the drawings.

First Embodiment: InP/GaInNAsP DBR mirror

Figure 2:
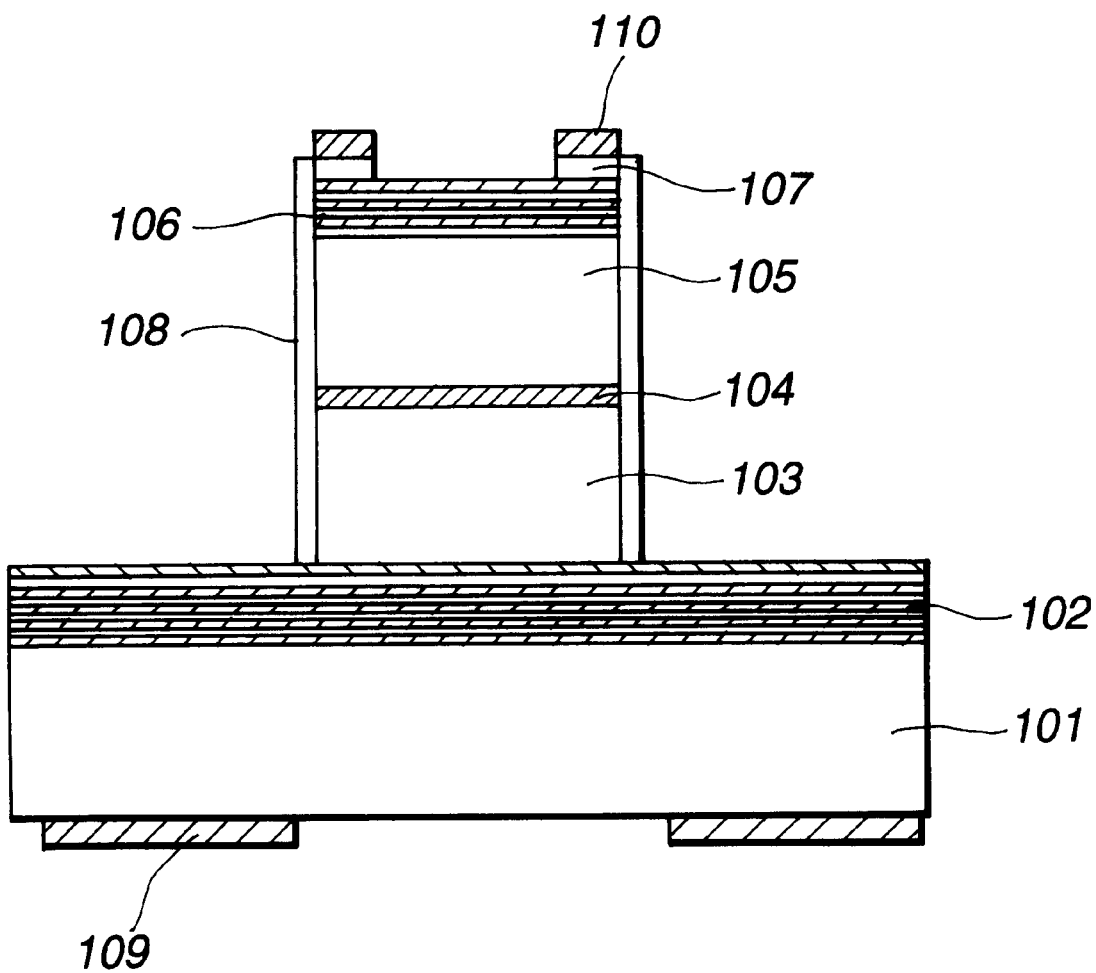
FIG. 2 is a schematic cross-sectional view illustrating a first embodiment of the present invention.
Figure 3:
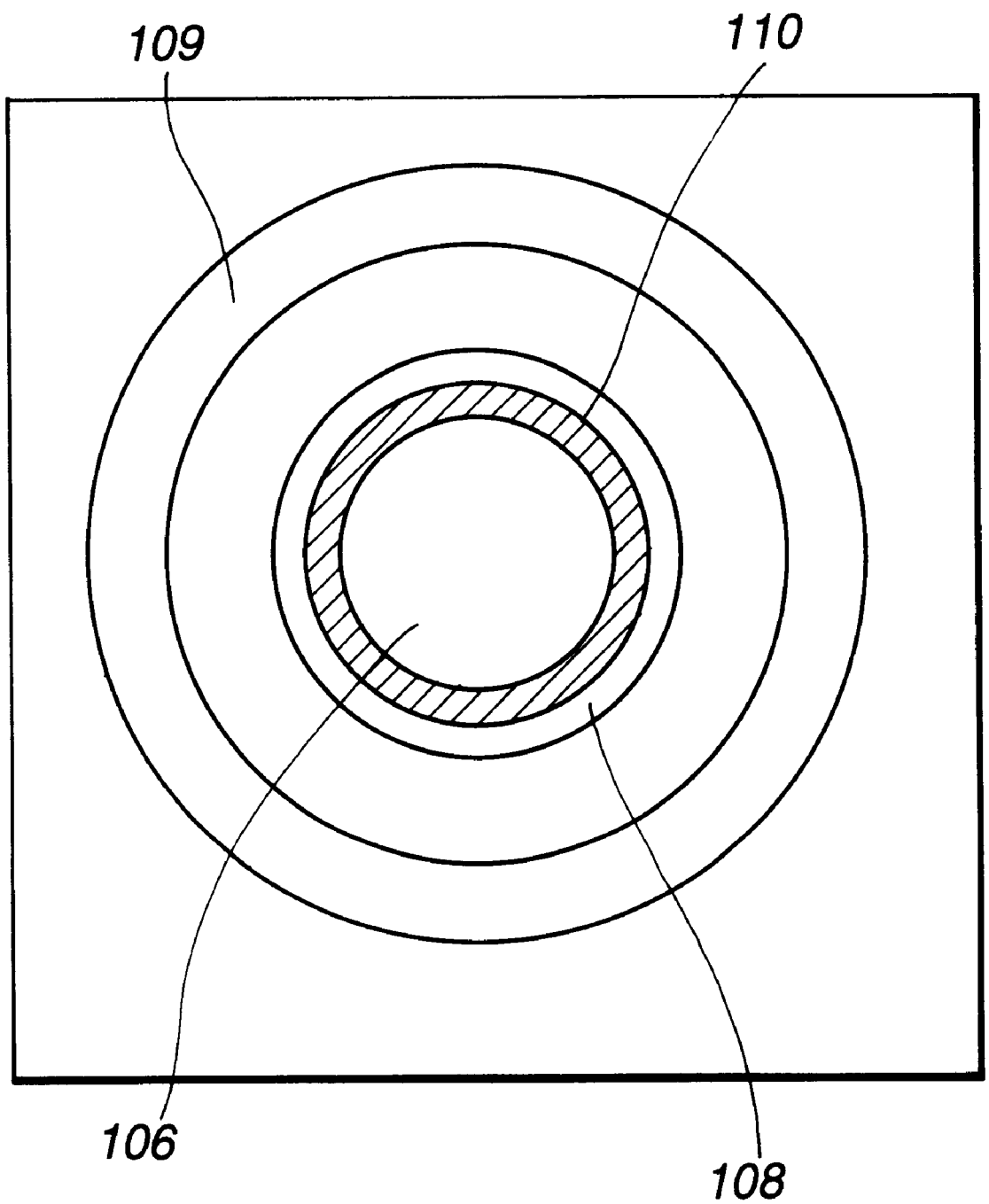
FIG. 3 is a plan view of the first embodiment shown in FIG. 2.
Figure 7:
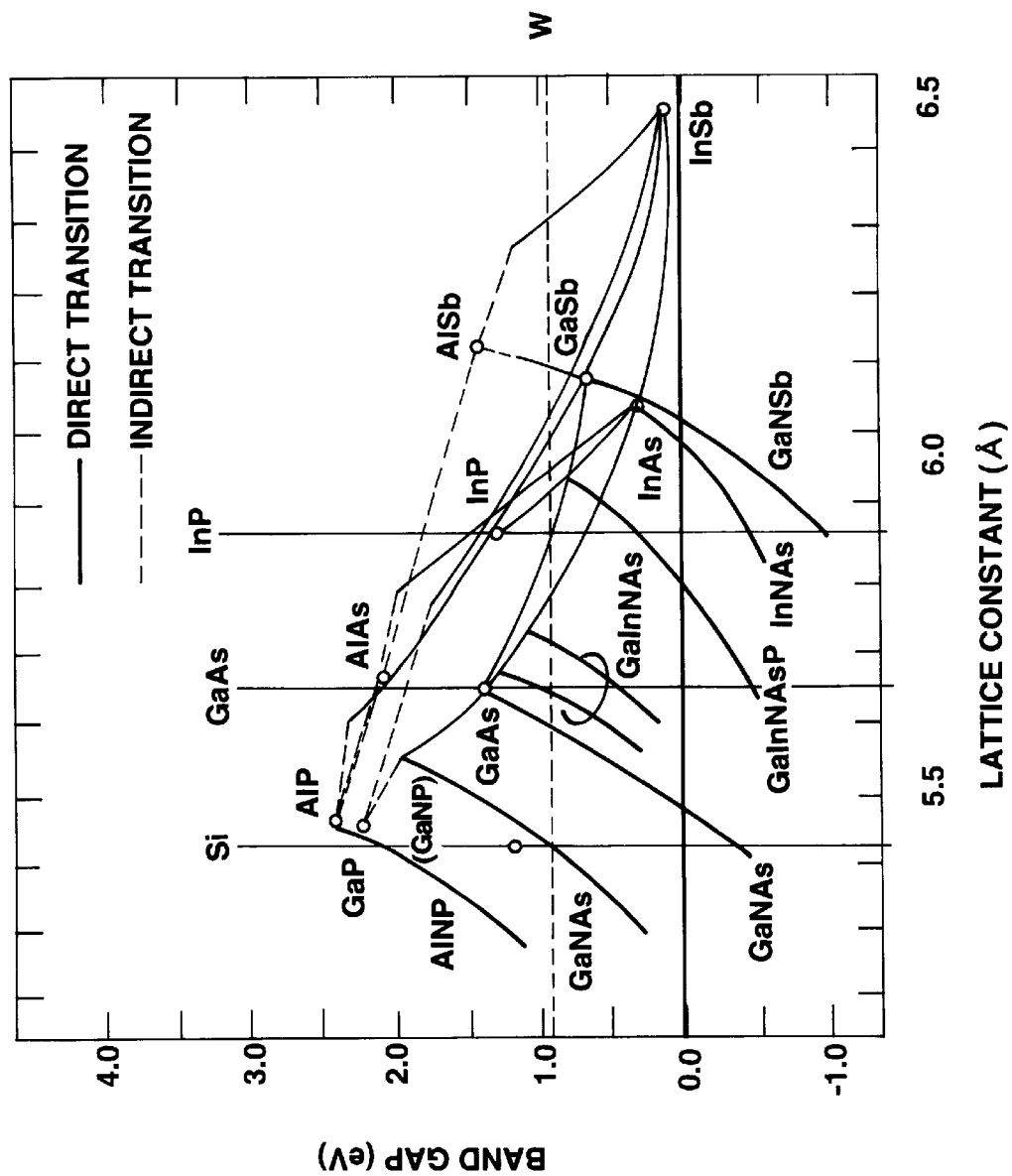
FIG. 7 is a view illustrating the relationship between lattice constants and band gap energies of III–V compound semiconductors.

FIGS. 2 and 3 illustrate a first embodiment of the present invention. Initially, its fabrication method will be described. The following semiconductor layers are epitaxially grown on a (100) n-InP substrate 101, for example, by using a chemical beam epitaxy (CBE) growth method. First, an n-GaInNAsP/InP DBR layer 102 is grown. Mole fractions of GaInNAsP are controlled such that the GaInNAsP is lattice-matched to InP (see an intersection between a thick line of GaInNAsP and a vertical line of InP in FIG. 7, and it can be seen therefrom that this intersection is adequately away from a point of InP and hence a large refractive-index difference is obtained). In this embodiment, a wavelength corresponding to a band gap energy of GaInNAsP is 1.50 $\mu$m. The layers of GaInNAsP and InP of the DBR layer 102 are made n-type by Si-doping, for example, such that a current can be injected thereinto. The thickness of each layer in the DBR mirror 102 is set to a quarter (¼) of an oscillation wavelength and four pairs of GaInNAsP/InP are deposited. Thus, a reflectance of 99% is achieved by the DBR mirror 102.

Figure 4:
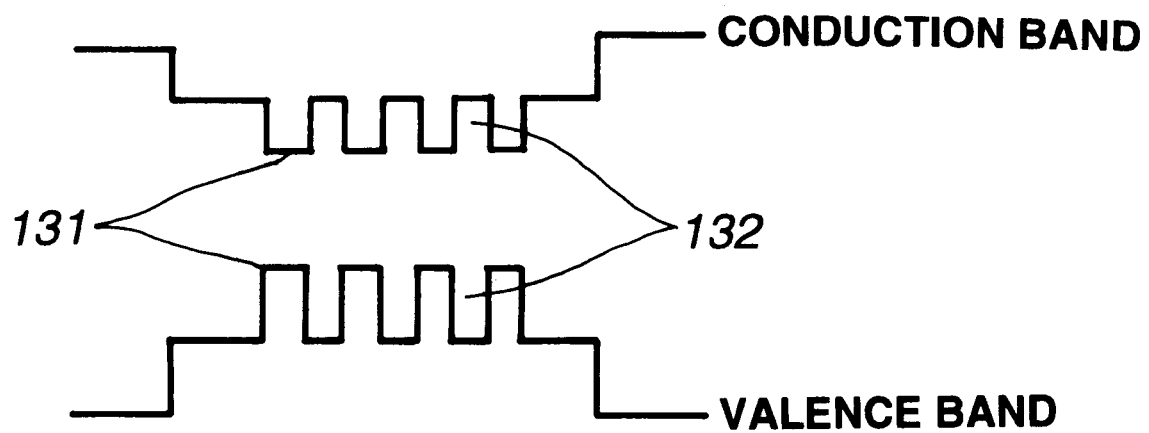
FIG. 4 is a view illustrating a band gap structure of an active layer of the first embodiment.

Next, an n-InP clad layer 103 of a carrier concentration of $10^{18}$ cm$^{-3}$ and a thickness of 1.5 $\mu$m and a strained quantum well active layer 104 are grown. In the first embodiment, the strained quantum well structure is used to decrease its threshold. Generally, the threshold can be greatly decreased by introducing the strain (especially, a compressive strain) into the quantum well structure. The band structure of the active layer 104 is shown in FIG. 4. The active layer 104 includes InGaAs well layers 131 (its thickness is 50 μm and an amount of its lattice mismatching is +0.6% (a compressive strain)) and InGaAsP barrier layers 132 (its oscillation wavelength is 1.15 μm and an amount of its lattice mismatching is 0%), and the number of the well layers 131 is four. As a result, a gain peak wavelength is 1.55 μm. The structure of the active layer is not limited thereto. The active layer may be an ordinary non-strained MQW active layer or a bulk active layer consisting of a single layer. Further, the active layer may be a MQW active layer including GaInNAs (see a fourth embodiment described later).

Next, a p-InP clad layer 105 of a carrier concentration of $10^{18}$ cm$^{-3}$ and a thickness of 1.5 μm and a p-GaInNAsP/InP DBR layer 106 are grown. The DBR layer 106 is the same as the DBR layer 102 except for its doping. The layers of GaInNAsP and InP in the DBR layer 106 are made p-type by Be-doping, for example, such that a current can be injected thereinto.

Further, a p-InGaAsP contact layer 107 of a wavelength corresponding to a band gap energy $E_g$ of 1.15 μm, a carrier concentration of $3 \times 10^{19}$ cm$^{-3}$, and a thickness of 0.5 μm is deposited.

A waveguide is formed in the thus-fabricated wafer. A cylindrical mesa with its diameter of 10 μm and its height of about 3 μm is formed by using chlorine-series dry etching or the like. Then, the etched side surface of the mesa is epitaxially coated with an undoped or Fe-doped high-resistance InP protective layer 108 using CBE or the like to remove etching damage and prevent an increase in new crystalline defects. Further, a round window for taking out light is formed on the wafer surface by wet etching. Another round window may be formed on the substrate 101 by wet etching. In this case, however, since the InP substrate 101 is transparent to the oscillation light, a window is not necessarily needed on the substrate 101.

Finally, the formation of electrodes is carried out. Ring-shaped electrodes 109 and 110 with an aperture diameter of 5 μm are formed on the n-type and p-type DBR mirrors 102 and 106, respectively. Thus, a vertical cavity surface emitting laser of the first embodiment is completed.

Figure 1:
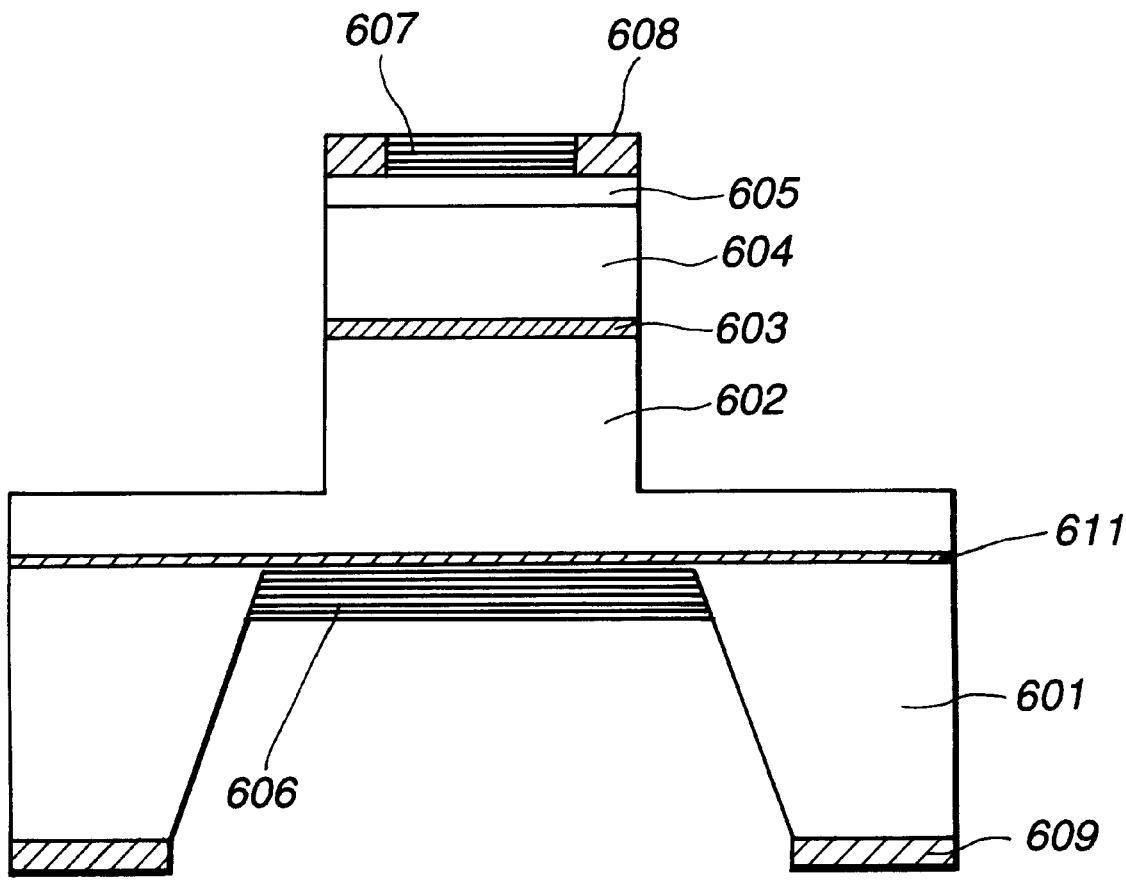
FIG. 1 is a schematic cross-sectional view illustrating the structure of a known VCSEL.
Figure 5:
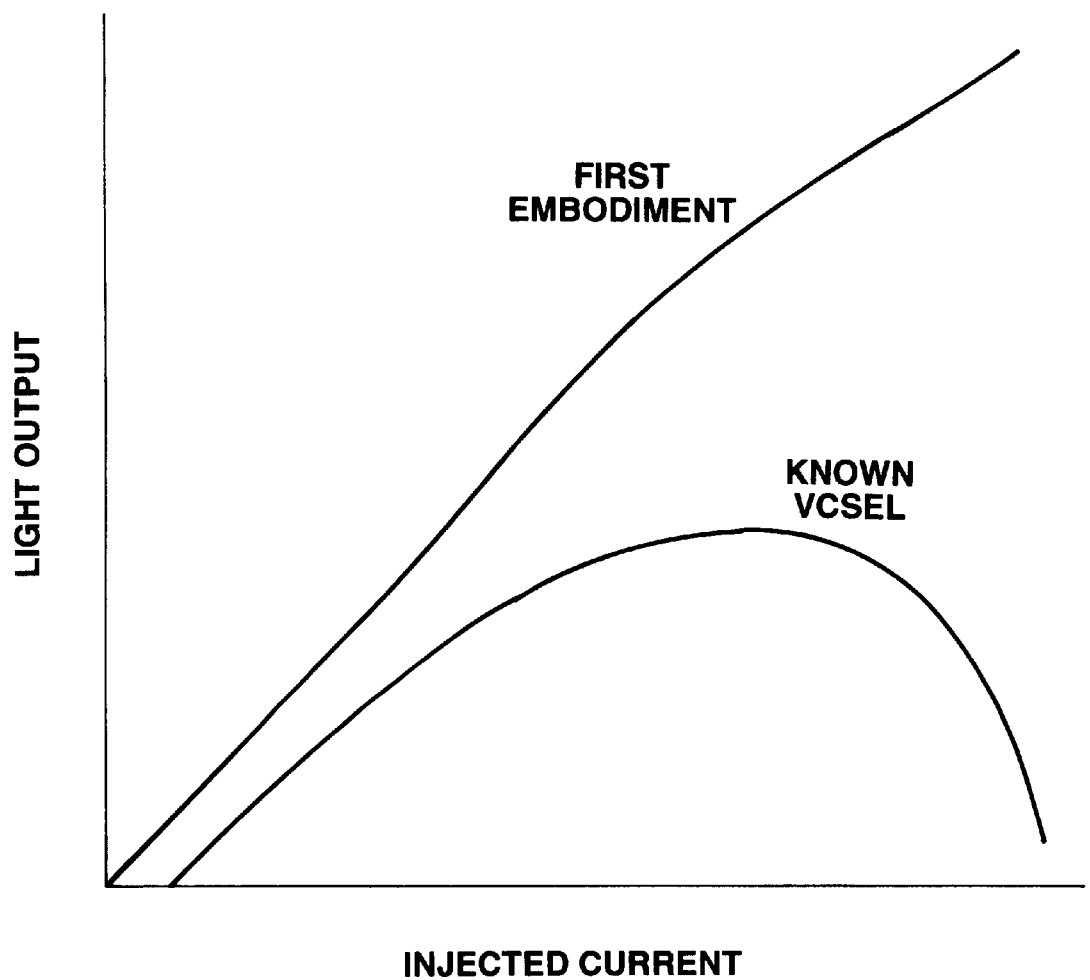
FIG. 5 is a view illustrating characteristics of injected-current versus light-output of the first embodiment and the known VCSEL illustrated in FIG. 1.

FIG. 5 shows injected-current versus light-output characteristic of the first embodiment, compared with that of the known art illustrated in FIG. 1. In this embodiment, its threshold current is decreased and its efficiency (i.e, a ratio between the injected current and the light output) is greatly improved. Those results from the formation of the DBR mirrors 102 and 106 with a high reflectance, a small electric resistance and a small thermal resistance.

Second Embodiment: InP/GaNSb DBR mirror

In the structure of the first embodiment, a GaNSb/InP mirror can be used as the DBR mirror. In this case, an n-GaNSb is used in place of the n-GaInNAs(P). Mole fractions of GaNSb are controlled such that the GaNSb is lattice-matched to InP (see an intersection between a thick line of GaNSb and a vertical line of InP in FIG. 7, from which it can be understood that this intersection is sufficiently distant from the point of InP and hence a large refractive-index difference is obtained). A wavelength corresponding to band gap energy of the GaNSb is approximately 1.6 μm. Other conditions of the second embodiment can be the same as those of the first embodiment. Therefore, the arrangement of the second embodiment can be understood with reference to FIGS. 2 and 3 which illustrate the arrangement of the first embodiment.

The effects of the first embodiment can also be obtained in the second embodiment. In addition thereto, in the second embodiment, the mole fractions of the GaNSb can be readily controlled with high precision since the GaNSb is a tertiary mixed crystal, the number of elements thereof is relatively small and only Ga is a III-group element. Therefore, the lattice-matching between the layers can be precisely carried out and no strain is accumulated, and hence the number of layers or the layer thickness can be increased.

Third Embodiment: GaAs/GaInNAs(P) DBR mirror

In a third embodiment, the present invention is applied to VCSEL using a GaAs substrate of a wavelength band of 1 μm. In the third embodiment, an InGaAs/GaAs MQW is used as the active layer and a GaInNAs/GaAs multi-layer is used as the DBR mirror. Other structures of the third embodiment are the same as the first embodiment. Therefore, the third embodiment will also be described with reference to FIGS. 2 and 3 which illustrate the first embodiment.

The following semiconductor layers are epitaxially grown on a (100) n-GaAs substrate 101, for example, by using CBE or the like. First, an n-GaInNAs/GaAs DBR layer 102 is grown. Mole fractions of GaInNAs are controlled such that the GaInNAs is lattice-matched to GaAs (see an intersection between the thick line of GaInNAs and the vertical line of GaAs in FIG. 7, from which it can be understood that this intersection is sufficiently distant from the point of GaAs and hence a large refractive-index difference is obtained). In this embodiment, a wavelength corresponding to a band gap energy of GaInNAs is 0.9 μm. The layers of GaInNAs and GaAs of the DBR layer 102 are made n-type by Si-doping, for example, such that a current can be injected thereinto. The thickness of each layer in the DBR mirror 102 is set to a quarter (¼) of an oscillation wavelength and four pairs of GaInNAs/GaAs are deposited. Thus, a reflectance of 99% is achieved by the DBR mirror 102. In this embodiment, GaInNAsP may be used in place of GaInNAs.

Next, an n-AlGaAs clad layer 103 having a carrier concentration of $1 \times 10^{18}$ cm$^{-3}$ and a thickness of 1.5 μm, and a strained quantum well active layer 104 are grown. Also in this embodiment, the compressively-strained quantum well structure is used to decrease the threshold. The active layer 104 includes InGaAs well layers and GaAs barrier layers, and mole fractions of InGaAs of the well layer are controlled such that its band gap wavelength is 0.95 μm.

Next, a p-GaAs clad layer 105 of a carrier concentration of $1 \times 10^{18}$ cm$^{-3}$ and a thickness of 1.5 μm and a p-GaNSb/InP DBR layer 106 are grown. The DBR layer 106 is the same as the DBR layer 102 except for its doping. Further, a p-type contact layer 107 of a carrier concentration of $3 \times 10^{19}$ cm$^{-1}$ and a thickness of 0.5 μm is deposited.

A waveguide is formed in the thus-layered wafer. A cylindrical mesa with its diameter of 10 μm and its height of about 3 μm is formed by using chlorine-series dry etching or the like. Then, the etched side surface of the mesa is epitaxially coated with an undoped or Fe-doped high-resistance GaAs protective layer 108 using CBE or the like to remove etching damage and prevent an increase in new crystalline defects. Further, a round window 120 for taking out light is formed on the substrate surface using wet etching.

Finally, the formation of electrodes is executed. Ring-shaped electrodes 109 and 110 with an aperture diameter of 5 μm are formed on the n-type and p-type DBR mirrors 102 and 106, respectively.

Particular effects or technical advantages of this embodiment are as follows. This embodiment can operate at still higher temperatures since the thermal conductivity of the GaAs/GaInNAs(P) is larger than that of AlGaAs/GaAs, which is larger than the thermal conductivity of InP/InGaAs (P). There is no fear that the device would be degraded or its lifetime would be shortened due to oxidation, since the DBR mirrors 102 and 106 include no Al which can be easily oxidized.

Fourth Embodiment: AlAs/GaInNAs DBR mirror

Figure 6:
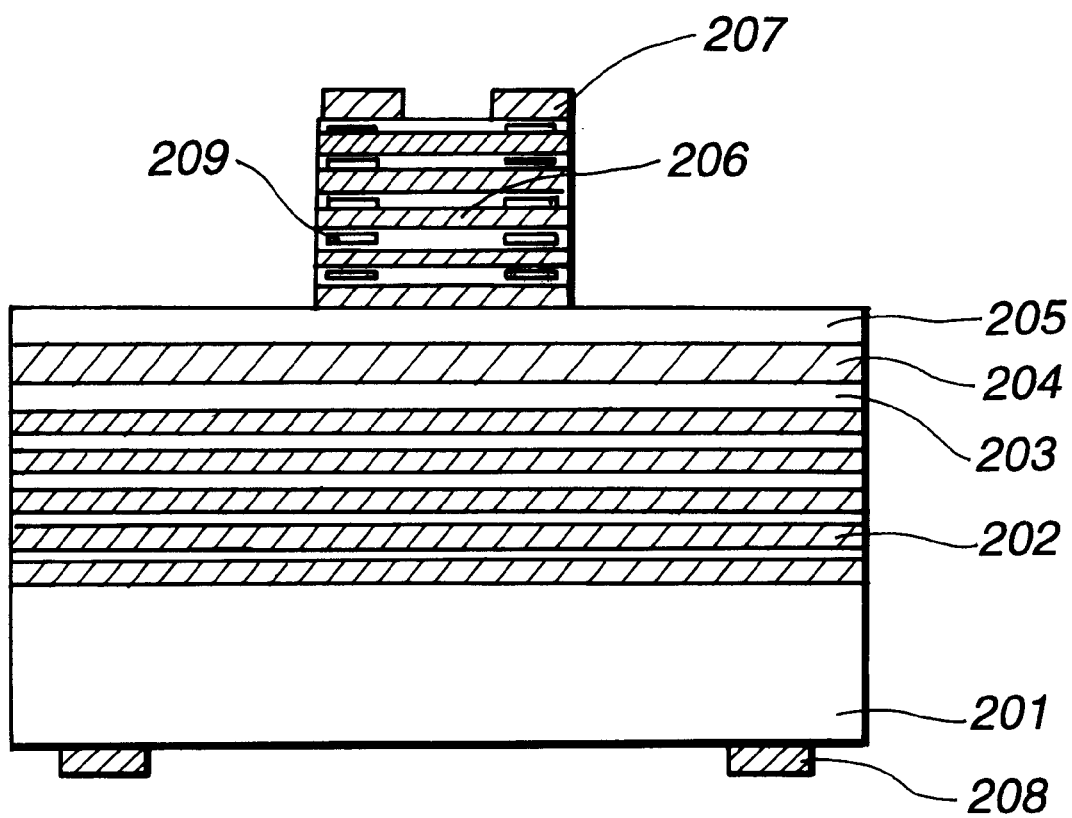
FIG. 6 is a schematic cross-sectional view illustrating a fourth embodiment of the present invention.

FIG. 6 shows a fourth embodiment of the present invention. In the fourth embodiment, layers are grown on a GaAs substrate. The fourth embodiment is fabricated in the following manner.

Figure 8:
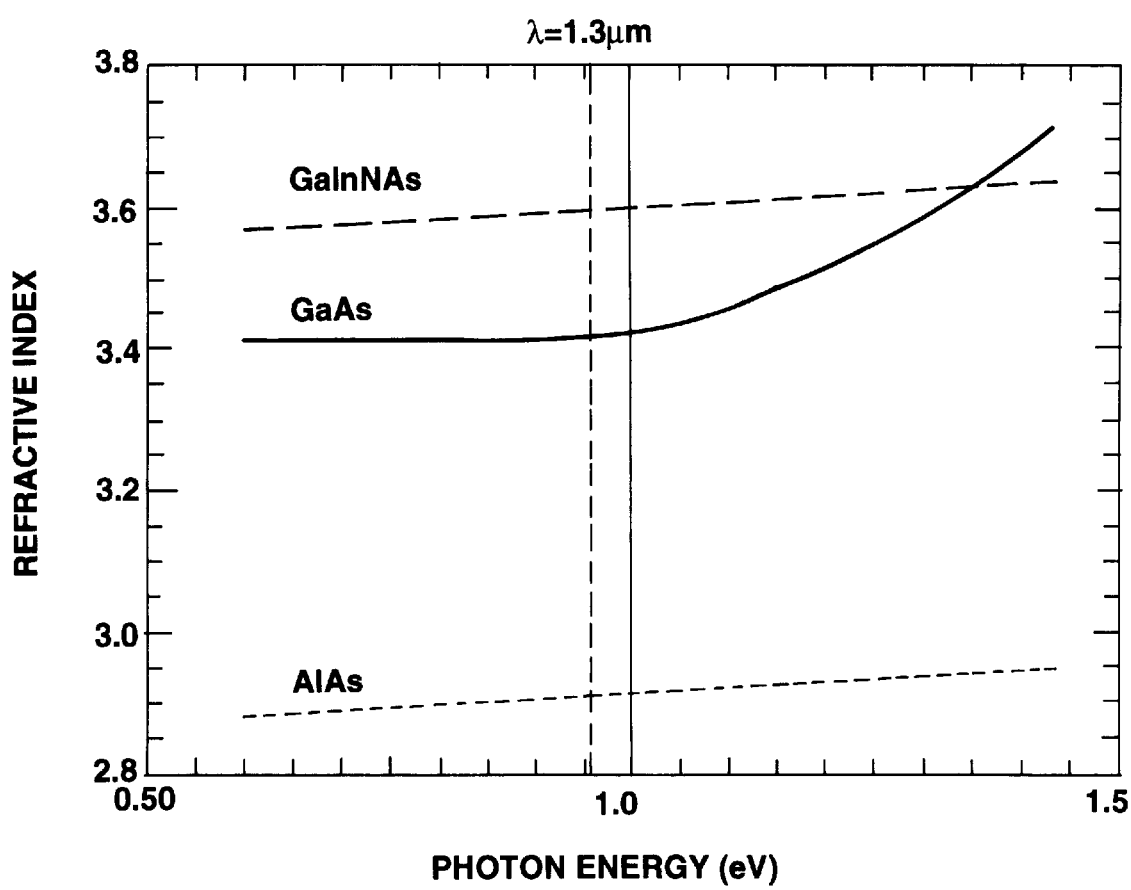
FIG. 8 is a view illustrating the relationship between refractive indices and photon energies of representative compound semiconductors.

The following semiconductor layers are epitaxially grown on an n-GaAs substrate 201, for example, by using CBE or the like. First, an n-AlAs/GaInNAs DBR layer 202 is grown. Mole fractions of GaInNAs are controlled such that the GaInNAs is lattice-matched to GaAs (see an intersection between the thick line of GaInNAs and the vertical line of GaAs in FIG. 7, from which it can be understood that this intersection is sufficiently distant from the point of AlAs and hence a large refractive-index difference is obtained, and also see FIG. 8). When the GaInNAs is $Ga_{0.8}In_{0.2}N_{0.02}As_{0.98}$, for example, its wavelength corresponding to a band gap energy is 1.05 μm. The layers of GaInNAs and AlAs in the DBR layer 202 are made n-type by Si-doping, for example, such that a current can be injected thereinto. The thickness of each layer is set to a quarter (¼) of an oscillation wavelength and fifteen (15) pairs of GaInNAs/AlAs are deposited. Thus, a reflectance of 99.99% is achieved.

Figure 9:
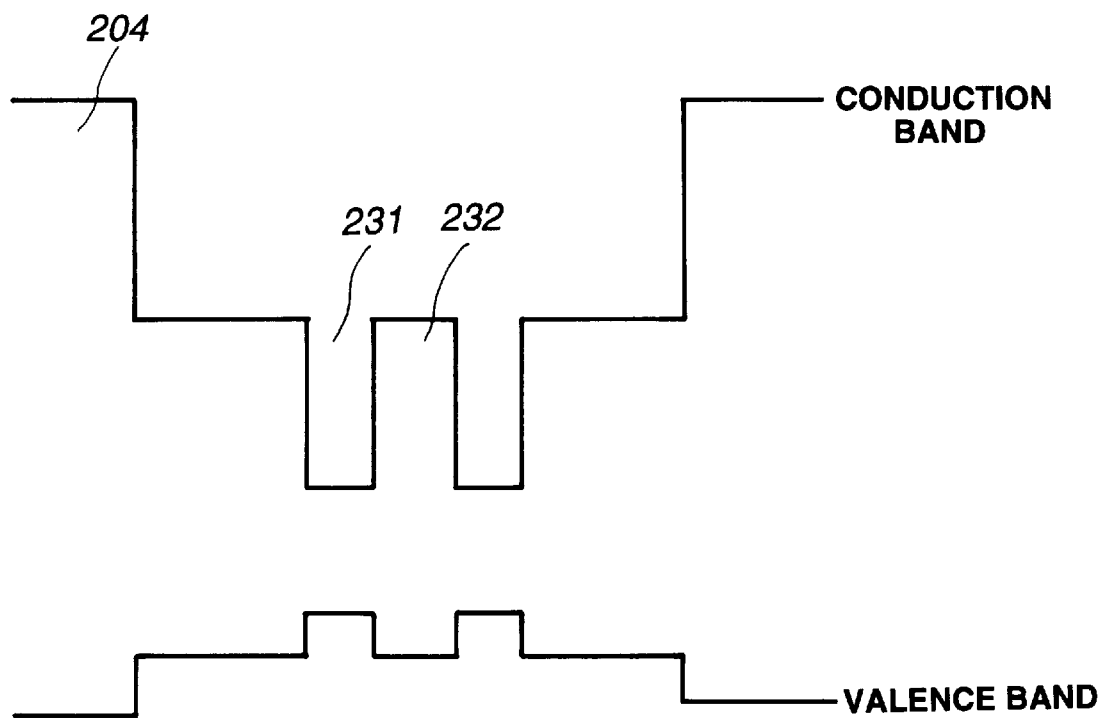
FIG. 9 is a view illustrating a band gap structure of an active layer of the fourth embodiment.

Next, an n-$Al_{0.3}Ga_{0.7}As$ spacer layer 203, having a carrier concentration of $1\times10^{18}$ cm$^{-3}$ and a thickness of 170 nm, and a strained quantum well active layer 204 are grown. The active layer 204 of this embodiment has the following structure to obtain an oscillation wavelength of 1.3 μm. The band structure of the active layer 204 is shown in FIG. 9. The active layer 204 includes GaInNAs well layers 231 (its thickness is 6 nm and an amount of its lattice mismatching is +0.6% (a compressive strain)) and GaAs barrier layers 232 (its thickness is 10 nm), and the number of the well layers 231 is two. As a result, a gain peak wavelength is 1.3 μm.

Next, a p-$Al_{0.3}Ga_{0.7}As$ spacer layer 205, having a carrier concentration of $1\times10^{18}$ cm$^{-3}$ and a thickness of 170 nm, and a p-AlAs/GaInNAs DBR layer 206 are grown. The number of pairs of GaInNAs/AlAs in the DBR layer 206 is 10.5, considering a reflection phase thereat. The layers of GaInNAs and AlAs in the DBR layer 206 are made p-type by Be-doping, for example, such that a current can be injected thereinto. Further, a p-type GaAs contact layer (not shown in FIG. 6), having a carrier concentration of $3\times10^{19}$ cm$^{-3}$ and a thickness of 0.2 μm, is deposited.

The thickness of each of the lower and upper spacer layers 203 and 205 is set to 0.17 μm as described above to decrease the threshold by setting the cavity length to a single wavelength and placing the active layer 204 at its center where the light density is maximum. Also for this purpose, the number of paired layers of the DBR layer 206 is set to 10.5, as discussed above.

A waveguide is formed in the thus-layered wafer. A cylindrical mesa with its diameter of 15 μm is formed with its height being extended to the upper surface of the p-type spacer layer 205, by using chlorine-series dry etching or the like. Then, a part of the AlAs layer of the p-GaInNAs/AlAs is oxidized by thermally processing the wafer in water vapor. Thus, a current constriction structure 209 is built.

Finally, the formation of electrodes is carried out. Ring-shaped electrodes 207 and 208 with an aperture diameter of 10 μm are formed on the n-type and p-type DBR mirrors 202 and 206, respectively.

Figure 10:
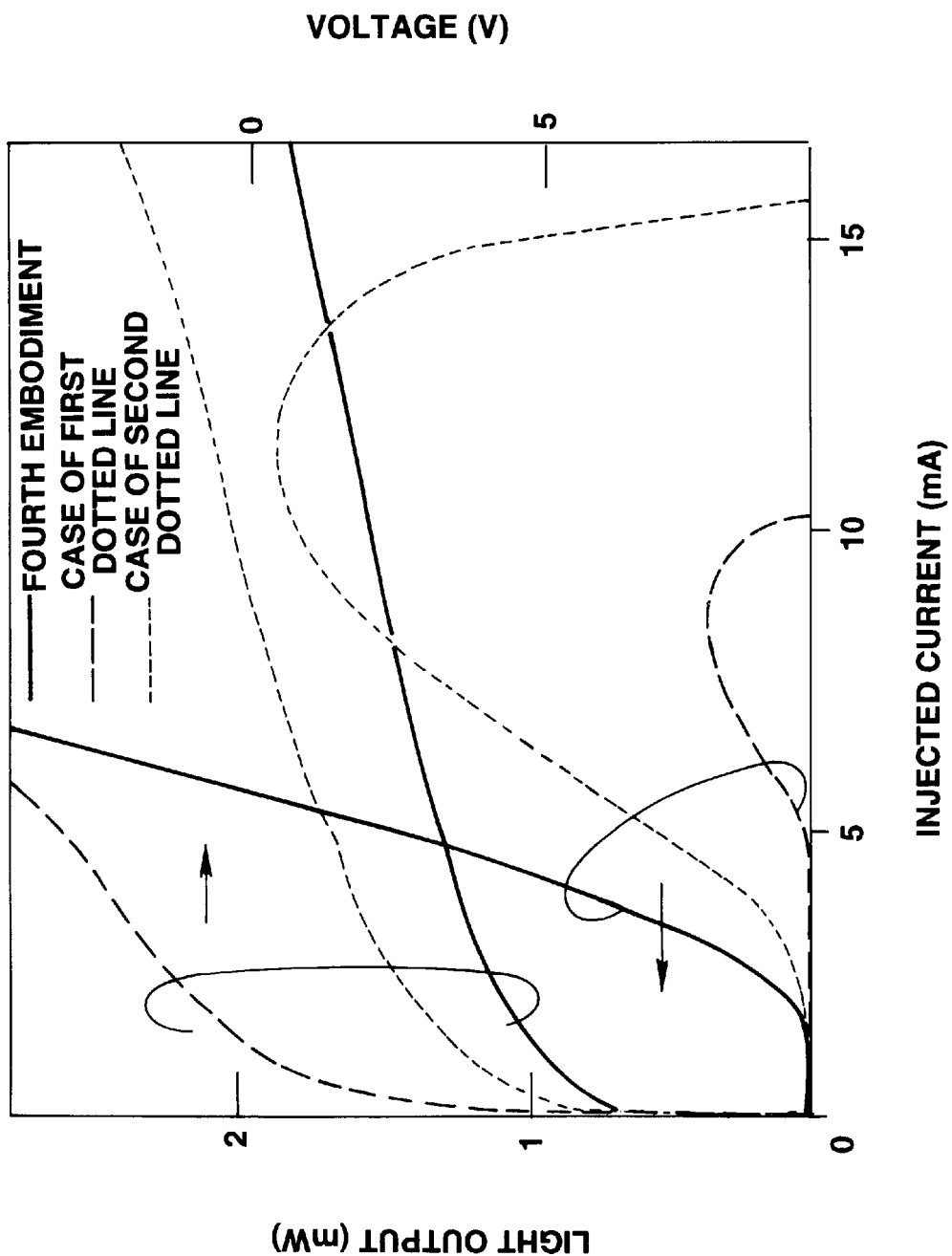
FIG. 10 is a view illustrating characteristics of injected-current versus light-output and injected-current versus voltage of the fourth embodiment and two conventional cases.

FIG. 10 shows the characteristic or effect of this embodiment. Its abscissa indicates a driving current (CW driving), its left-side ordinate indicates a light output and its right-side ordinate indicates a voltage. In FIG. 10, a solid line shows the fourth embodiment, a first dotted line shows a case of VCSEL which has an InGaAsP/InGaAs MQW active layer and AlAs/GaAs multi-layer mirrors formed on an InP substrate, and a second dotted line shows a case of VCSEL which has a GaInNAs/GaAs MQW active layer and AlAs/GaAs multi-layer mirrors formed on a GaAs substrate. A difference between the fourth embodiment and the case of the first dotted line is attributable to differences of the active layer and the multi-layer mirrors, and a difference between the fourth embodiment and the case of the second waved line is attributable to a difference of the multi-layer mirrors. In the case of the first dotted line, while its threshold is relatively small, about 5 mA, its light output is shortly saturated due to synthetic effects of the mirrors having large electrical and thermal resistances and the active layer which is vulnerable to thermal change. Turning to the case of the second dotted line, its characteristic is improved, compared with the case of the first dotted line, since the active layer including GaInNAs, which is excellent in its temperature characteristic, is used. However, thermal saturation occurs therein since the electric resistance of its mirrors is still large. In contrast, in the fourth embodiment, disadvantages of the known art in threshold current, light output and efficiency are drastically improved since both the active layer and the mirrors are greatly modified. Further, in the fourth embodiment, the driving voltage would not greatly increase, as seen from FIG. 10, since the electric resistance of the mirrors is low. Such an active layer can be used in each of the first to third embodiments to further improve characteristics of the device.

Fifth Embodiment; AlGaAs/GaInNAsP DBR mirror

In the structure of the fourth embodiment, an AlGaAs/GaInNAsP mirror can be used as the DBR mirror in place of the AlAs/GaInNAs mirror. Further, in order to lower the driving voltage by decreasing the resistance of the DBR mirror, the DBR mirror can has a graded structure in which the hetero-gap at the interface between the layers of the DBR mirror is gradually varied. The graded structure can be built by gradually changing the mode fraction of N in GaInNAs (P), for example. The effect of the fifth embodiment using the AlGaAs/GaInNAsP mirror is that the lattice constant and refractive index can be further flexibly controlled by adjusting the mole fractions of a relatively large number of constituent elements.

Sixth Embodiment

Figure 11:
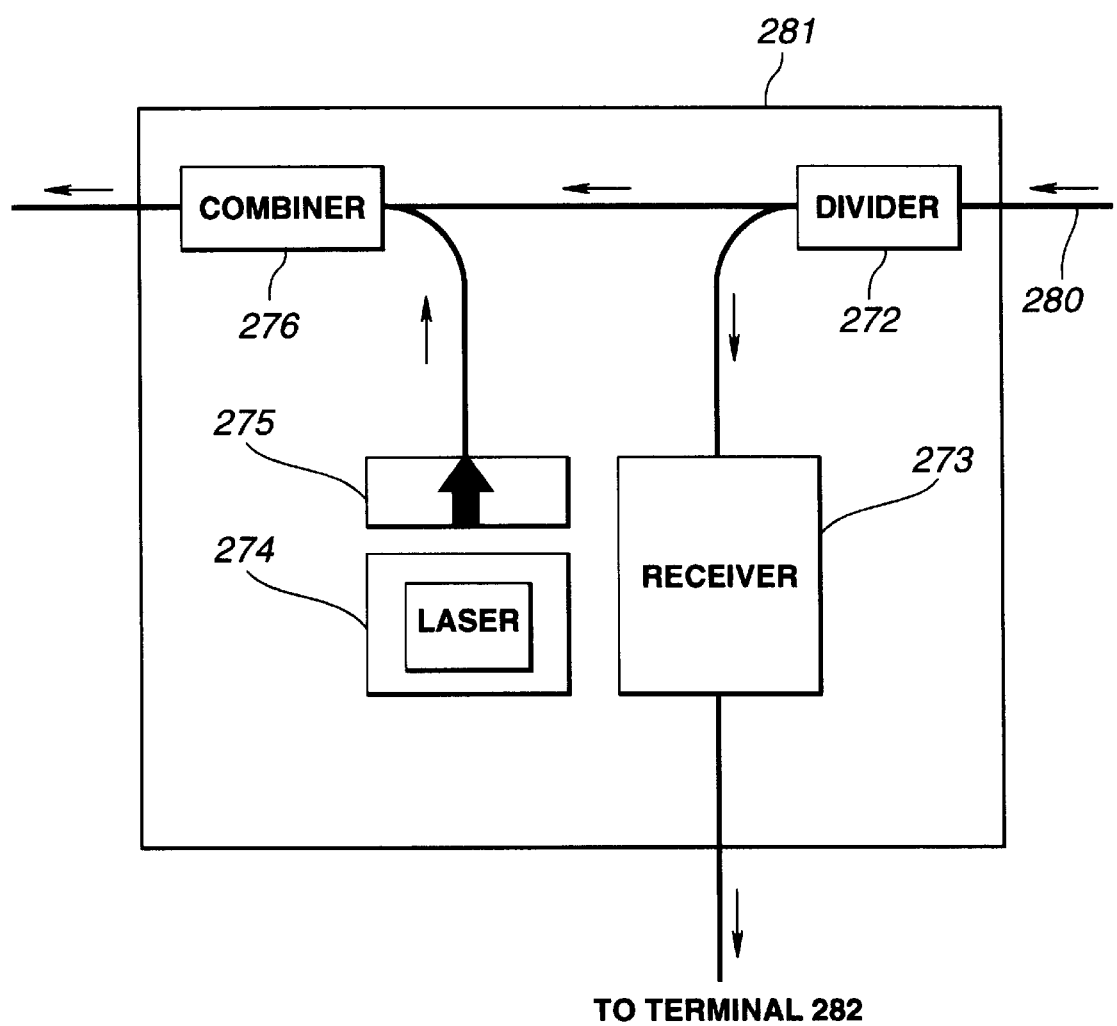
FIG. 11 is a block diagram illustrating the structure of a node (a transceiver) using a vertical-cavity surface emitting laser of the present invention and used in an optical transmission system.

A sixth embodiment will be described with reference to FIGS. 11 and 12. The sixth embodiment is directed to a wavelength division multiplexing optical local area network (LAN) system using a VCSEL 274 of the present invention. FIG. 11 illustrates an opto-electric converting unit (node) 281 including the VCSEL 274, which is connected to a terminal of the optical LAN system shown in FIG. 12.

Figure 12:
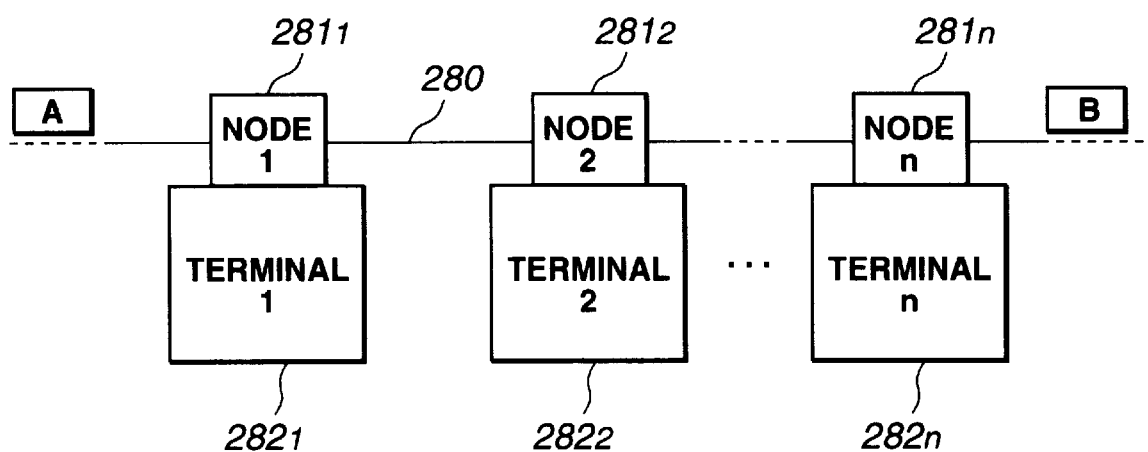
FIG. 12 is a schematic block diagram illustrating the structure of a bus-type optical communication system using the node of FIG. 11.

In the bus-type network shown in FIG. 12, multiple terminals $282_1$, $282_2$, ..., and $282_n$ are respectively connected to an optical fiber 280 through nodes $281_1$, $281_2$, ..., and $281_n$ along a direction A–B. At some places on the optical fiber 280, optical amplifiers (not shown) are serially connected to compensate for attenuation of the transmitted signal light.

In FIG. 11, a light signal is taken into the node 281 through the optical fiber 280, and a portion of the signal is input into an optical receiver 273 by a divider or branching device 272. The optical receiver 273 includes a tunable optical filter and a photodetector, and only signal light at a desired wavelength is picked out from the incident signal light, and the signal is detected. The thus-detected signal is processed by a control circuit to be supplied to the terminal 282.

On the other hand, when a light signal is transmitted from the node 281, signal light from the light source apparatus or VCSEL 274 is input into the optical fiber 280 at a combiner 276 through an isolator 275. The VCSEL 274 is appropriately driven by a control circuit in accordance with a modulation current corresponding to a signal to be transmitted. The isolator 275 may be removed since the VCSEL 274 is a surface light-emitting laser with high-reflectance mirrors.

A plurality of tunable optical filters and VCSELs may be arranged in a node to widen the wavelength changeable range. Further, two nodes may be connected to each terminal 282 and two optical fibers may be provided to accomplish bi-directional transmission of a DQDB system.

In such an optical network system, when the optical communication system of the present invention is used, a high-density wavelength or optical frequency division multiplexing network can be constructed.

As a network, a loop type, which is constructed by connecting A and B in FIG. 12, a star type, or a compound configuration thereof may be used.

As described in the foregoing, according to the present invention, the following technical advantages can be obtained.

Since there is arranged a semiconductor multi-layer mirror with a high reflectance and a small thermal resistance in a surface light-emitting device of the present invention, (1) operation current can be lowered, (2) the device can operate with a low voltage and a low resistance since the number of layers in the mirror is small, (3) its temperature characteristic can be notably improved due to its excellent heat radiation, and (4) the fabrication method can be simplified and its cost can be reduced since the semiconductor multi-layer mirror can be formed together with other semiconductor layers during a crystalline growth time.

Further, when a surface light-emitting device of the present invention is used in an optical transmitter or an optical communication system, a practical apparatus or system with high quality can be built relatively readily.

Except as otherwise disclosed herein, the various components shown in outline or block form in any of the FIGS. 1–12 are individually well known in the optical semiconductor device, driving method therefor and optical communication arts, and their internal construction and operation are not described herein.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A multi-layer mirror comprising:
a plurality of layers of compound semiconductors,
wherein said plurality of layers of compound semiconductors comprise a plurality of sets of paired layers,
wherein each said set of paired layers comprises a semiconductor layer including no nitrogen and a semiconductor layer including nitrogen, and
wherein the semiconductor layer including no nitrogen and the semiconductor layer including nitrogen are, respectively:
   (a) InP and GaInNAsP;
   (b) GaAs and GaInNAsP;
   (c) AlAs and GaInNAsP; or
   (d) AlGaAs and GaInNAsP.

2. A multi-layer mirror comprising:
a plurality of layers of compound semiconductors,
wherein said plurality of layers of compound semiconductors comprise a plurality of sets of paired layers,
wherein each said set of paired layers comprises a semiconductor layer including no nitrogen and a semiconductor layer including nitrogen, and
wherein the semiconductor layer including no nitrogen and the semiconductor layer including nitrogen are, respectively:
   (a) InP and GaNSb; or
   (b) AlGaAs and GaInNAs.

3. A surface light-emitting device comprising:
an active layer; and
a set of reflectors, said reflectors being arranged on both opposite sides of said active layer such that light can be emitted in a direction perpendicular to said active layer, and at least a portion of said reflectors comprising a plurality of layers of compound semiconductors,
wherein said plurality of layers of compound semiconductors comprise a plurality of sets of paired layers,
wherein each said set of paired layers comprises a semiconductor layer including no nitrogen and a semiconductor layer including nitrogen, and
wherein the semiconductor layer including no nitrogen and the semiconductor layer including nitrogen are, respectively:
   (a) InP and GaInNAsP;
   (b) GaAs and GaInNAsP;
   (c) AlAs and GaInNAsP;
   (d) AlGaAs and GaInNAsP;
   (e) InP and GaNSb; or
   (f) AlGaAs and GaInNAs.

4. A multi-layer mirror according to claim 2, wherein said semiconductor layer including no nitrogen and said semiconductor layer including nitrogen are approximately lattice-matched to each other.

5. A multi-layer mirror according to claim 2, wherein at least one of said compound semiconductors comprises aluminum (Al).

6. A multi-layer mirror according to claim 1, wherein said semiconductor layer including no nitrogen and said semiconductor layer including nitrogen are approximately lattice-matched to each other.

7. A multi-layer mirror according to claim 1, wherein each of said plurality of sets of paired layers comprises a semiconductor layer of InP and a semiconductor layer of GaInNAsP.

8. A multi-layer mirror according to claim 2, wherein each of said plurality of sets of paired layers comprises a semiconductor layer of InP and a semiconductor layer of GaNSb.

9. A multi-layer mirror according to claim 1, wherein each of said plurality of sets of paired layers comprises a semiconductor layer of GaAs and a semiconductor layer of GaInAsP.

10. A multi-layer mirror according to claim 1, wherein at least one of said compound semiconductors comprises aluminum (Al).

11. A multi-layer mirror according to claim 1, wherein each of said plurality sets of paired layers comprises a semiconductor layer of one of AlAs and AlGaAs and a semiconductor layer of GaInNAsP.

12. A surface light-emitting device according to claim 3, wherein each of said plurality of sets of paired layers comprises a semiconductor layer of InP and a semiconductor layer of GaInNAsP.

13. A surface light-emitting device according to claim 3, wherein each of said plurality of sets of paired layers comprises a semiconductor layer of InP and a semiconductor layer of GaNSb.

14. A surface light-emitting device according to claim 3, wherein each of said plurality of sets of paired layers comprises a semiconductor layer of GaAs and a semiconductor layer of GaInNAsP.

15. A surface light-emitting device according to claim 3, wherein said active layer includes nitrogen.

16. A surface light-emitting device according to claim 3, wherein at least one of said compound semiconductors includes aluminum (Al).

17. A surface light-emitting device according to claim 16, wherein each of said plurality of sets of paired layers comprises a semiconductor layer of one of AlAs and AlGaAs and a semiconductor layer of GaInNAsP.

18. A surface light-emitting device according to claim 14, wherein said active layer includes nitrogen.

19. A surface light-emitting device according to claim 14, wherein portions of said layers of compound semiconductor including Al are oxidized to be high-resistance portions such that carriers injected into said layers of compound semiconductors are constricted.

20. A surface light-emitting device according to claim 3, further comprising a waveguide, and wherein said waveguide contains said active layer, said waveguide is etched into a form of column, and a protective layer is deposited on a side surface of the column.

21. A surface light-emitting device according to claim 3, further comprising a ring-shaped electrode formed on a surface of said reflector including said plurality of layers of compound semiconductors.

22. A surface light-emitting device according to claim 3, wherein a cavity length between said set of reflectors is set to a single wavelength, and said active layer is placed at a center of said cavity length.

23. A surface light-emitting device according to claim 3, wherein each of hetero-gaps at multi-layer interfaces in said reflector comprising said plurality of layers of compound semiconductors is gradually changed to form a graded structure.

* * * * *

UNITED STATES PATENT AND TRADEMARK OFFICE
CERTIFICATE OF CORRECTION

PATENT NO. : 6,057,560
DATED : May 2, 2000
INVENTOR(S) : Mamoru Uchida

It is certified that error appears in the above-identified patent and that said Letters Patent is hereby corrected as shown below:

Title page,
Item [54],
"MULTI-LAYER, MIRROR" should read -- MULTI-LAYER MIRROR --.

Item [56] References Cited - Other Publications,
"Long-Wavelength-RAnge" should read -- Long-Wavelength-Range --.

Column 1,
Line 1, "MULTI-LAYER, MIRROR" should read -- MULTI-LAYER MIRROR --.

Column 2,
Line 18, "can not" should read -- cannot --.

Column 4,
Line 36, "as has" should read -- needs --.
Line 37, "is needed" should be deleted.

Column 5,
Line 29, "cofiguration." should read -- configuration. --.

Column 7,
Line 43, "teristic" should read -- teristics --.

Column 8,
Line 49, "$cm^{-1}$" should read -- $cm^{-3}$ --.

Column 10,
Line 40, "has" should read -- have --.

Column 12,
Line 65, "plurality" should read -- plurality of --.

UNITED STATES PATENT AND TRADEMARK OFFICE
CERTIFICATE OF CORRECTION

PATENT NO.   : 6,057,560
DATED        : May 2, 2000
INVENTOR(S)  : Mamoru Uchida It is certified that error appears in the above-identified patent and that said Letters Patent is hereby corrected as shown below:

<u>Column 13,</u>
Line 22, "claim 14," should read -- claim 16, --.
Line 24, "claim 14," should read -- claim 16, --.

Signed and Sealed this

Twenty-third Day of October, 2001

Attest:

*Nicholas P. Godici*

NICHOLAS P. GODICI
*Attesting Officer*            *Acting Director of the United States Patent and Trademark Office*